(12) United States Patent
Lamansky et al.

(10) Patent No.: US 9,537,116 B2
(45) Date of Patent: Jan. 3, 2017

(54) TRANSPARENT OLED LIGHT EXTRACTION

(71) Applicant: 3M INNOVATIVE PROPERTIES COMPANY, St. Paul, MN (US)

(72) Inventors: Sergey Lamansky, Redmond, WA (US); Ghidewon Arefe, St. Paul, MN (US); Keith L. Behrman, Bangkok (TH); Steven J. McMan, Stillwater, MN (US); Jonathan A. Anim-Addo, New Hope, MN (US); William A. Tolbert, Woodbury, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 0 days.

(21) Appl. No.: 14/420,747

(22) PCT Filed: Aug. 15, 2013

(86) PCT No.: PCT/US2013/055043
§ 371 (c)(1),
(2) Date: Feb. 10, 2015

(87) PCT Pub. No.: WO2014/031421
PCT Pub. Date: Feb. 27, 2014

(65) Prior Publication Data
US 2015/0228931 A1    Aug. 13, 2015

Related U.S. Application Data

(60) Provisional application No. 61/691,945, filed on Aug. 22, 2012.

(51) Int. Cl.
*H01L 33/00*    (2010.01)
*H01L 51/52*    (2006.01)
(Continued)

(52) U.S. Cl.
CPC ......... *H01L 51/5275* (2013.01); *G02B 5/1866* (2013.01); *H01L 51/5012* (2013.01);
(Continued)

(58) Field of Classification Search
CPC ... H01L 27/1214; H01L 27/12; H01L 51/0545
(Continued)

(56) References Cited

U.S. PATENT DOCUMENTS

| | | | |
|---|---|---|---|
| 5,952,778 A * | 9/1999 | Haskal | H01L 51/5256 313/504 |
| 6,432,137 B1 * | 8/2002 | Nanushyan | A61L 27/18 525/478 |

(Continued)

FOREIGN PATENT DOCUMENTS

| | | |
|---|---|---|
| JP | 2012-109262 | 6/2012 |
| WO | WO 2013-130247 | 9/2013 |
| WO | WO 2014-031360 | 2/2014 |

OTHER PUBLICATIONS

Cardenas "Optical characterization of $MoO_3$ thin films produced by continuous wave $CO_2$ laser-assisted evaporation", Thin Solid Films, May 2005, vol. 478, No. 1-2, pp. 146-151.

(Continued)

*Primary Examiner* — Thao X Le
*Assistant Examiner* — Eric Jones
(74) *Attorney, Agent, or Firm* — Daniel J. Iden

(57) ABSTRACT

The present disclosure provides novel light emitting devices including AMOLED displays, based on transparent OLED architecture, where a laminated nanostructured light extraction film can produce axial and integrated optical gains as well as improved angular luminance and color. Generally, the transparent AMOLED displays (100) with laminated sub-micron extractors (110*a-c*) include: (a) an extractor (110*a*) on a transparent substrate (112*a*) for light outcou-
(Continued)

pling on both sides of the transparent device (120); or (b) an extractor (110*b*) on a reflective film (112*b*) for providing light outcoupling off the bottom side of the bottom-emitting (BE) AMOLED (120); or (c) an extractor (110*c*) on a light absorbing film (112*c*) for providing outcoupling off the bottom side of the BE AMOLED (120) combined with improved ambient contrast.

25 Claims, 5 Drawing Sheets

(51) Int. Cl.
 *G02B 5/18* (2006.01)
 *H01L 51/50* (2006.01)
 *H01L 29/04* (2006.01)
 *H01L 29/10* (2006.01)
 *H01L 31/00* (2006.01)

(52) U.S. Cl.
 CPC ........ *H01L 51/524* (2013.01); *H01L 51/5215* (2013.01); *H01L 51/5234* (2013.01); *H01L 51/5268* (2013.01); *H01L 2251/5323* (2013.01)

(58) Field of Classification Search
 USPC ........................................ 257/40, 59, 88, 98
 See application file for complete search history.

(56) References Cited

U.S. PATENT DOCUMENTS

| | | | |
|---|---|---|---|
| 6,433,355 B1* | 8/2002 | Riess | H01L 51/5206 257/103 |
| 7,140,812 B2 | 11/2006 | Bryan | |
| 7,468,211 B2 | 12/2008 | McCormick | |
| 7,473,932 B2* | 1/2009 | Cho | H01L 51/5262 257/40 |
| 7,834,539 B2 | 11/2010 | Handa | |
| 2004/0033369 A1* | 2/2004 | Fleming | B32B 7/10 428/431 |
| 2004/0183433 A1* | 9/2004 | Cho | H01L 51/5262 313/504 |
| 2006/0049745 A1* | 3/2006 | Handa | H01L 51/5268 313/503 |
| 2007/0020451 A1 | 1/2007 | Padiyath | |
| 2007/0216300 A1* | 9/2007 | Lee | B05D 1/60 313/512 |
| 2008/0006819 A1* | 1/2008 | McCormick | H01L 51/5237 257/40 |
| 2008/0054275 A1* | 3/2008 | Vogel | H01L 27/3227 257/84 |
| 2008/0297045 A1* | 12/2008 | Cok | B82Y 20/00 313/506 |
| 2009/0015142 A1 | 1/2009 | Potts | |
| 2009/0015757 A1 | 1/2009 | Potts | |
| 2009/0224660 A1* | 9/2009 | Nakanishi | H01L 51/5262 313/504 |
| 2010/0110551 A1 | 5/2010 | Lamansky | |
| 2010/0128351 A1 | 5/2010 | Epstein | |
| 2011/0262093 A1* | 10/2011 | Lamansky | B82Y 20/00 385/131 |
| 2012/0050735 A1* | 3/2012 | Higgins | G01L 1/24 356/326 |
| 2012/0153333 A1 | 6/2012 | Yamazaki | |
| 2012/0234460 A1 | 9/2012 | Zhang | |
| 2013/0051032 A1 | 2/2013 | Jones | |

OTHER PUBLICATIONS

International Search Report for PCT International Application No. PCT/US2013/055043 mailed on Dec. 10, 2013, 5 pages.

\* cited by examiner

TRANSPARENT OLED LIGHT EXTRACTION

CROSS REFERENCE TO RELATED APPLICATIONS

This application is a national stage filing under 35 U.S.C. 371 of PCT/US2013/055043, filed Aug. 15, 2013, which claims priority to U.S. Provisional Application No. 61/691,945, filed Aug. 22, 2012, the disclosure of which is incorporated by reference in its/their entirety herein.

RELATED APPLICATION

This application is related to the following U.S. patent application, which is incorporated herein by reference: "MICROCAVITY OLED LIGHT EXTRACTION" 61/691,949, filed on an even date herewith.

BACKGROUND

Organic Light Emitting Diode (OLED) devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

In OLED devices, over 70% of the generated light is typically lost due to processes within the device structure. The trapping of light at the interfaces between the higher index organic and Indium Tin Oxide (ITO) layers and the lower index substrate layers is one cause of this poor extraction efficiency. Only a relatively small amount of the emitted light can emerge through the transparent electrode as "useful" light. Much of the light undergoes internal reflections, resulting in light being emitted from the edge of the device or trapped within the device and eventually being lost to absorption within the device after making repeated passes. Light extraction films use internal nanostructures that can reduce such waveguiding losses within the device.

Active Matrix OLED (AMOLED) displays are gaining prominence in the displays market. While mobile AMOLED displays are nearly all represented by so-called top-emissive architecture where the OLED is built on top of a reflective bottom electrode, the television market will likely rely on the so-called bottom-emissive design where the reflective electrode is deposited after the OLED organic layers. A bottom-emissive architecture for an AMOLED TV is attractive from the prospective of a better control of luminance angularity, simpler manufacturing process and the ability to achieve reasonably high aperture ratio with larger pixel sizes. However, bottom-emissive design options for controlling such important optical parameters such as light outcoupling (light extraction) or ambient contrast are limited.

SUMMARY

The present disclosure provides novel light emitting devices including AMOLED displays, based on transparent OLED architecture, where a laminated nanostructured light extraction film can produce axial and integrated optical gains as well as improved angular luminance and color. Generally, the transparent AMOLED displays with laminated sub-micron extractors include: (a) an extractor on a transparent substrate for light outcoupling on both sides of the transparent device; or (b) an extractor on a reflective film for providing light outcoupling off the bottom side of the bottom-emitting (BE) AMOLED; or (c) an extractor on a light absorbing film for providing outcoupling off the bottom side of the BE AMOLED combined with improved ambient contrast.

In one aspect, the present disclosure provides a light emitting device that includes an organic light emitting diode (OLED) device having a top electrode and an opposing bottom electrode disposed on a backplane, wherein each of the top electrode, the opposing bottom electrode and the backplane are substantially transparent to light emitted by the OLED device; a capping layer disposed immediately adjacent the top electrode; and a light extraction film disposed adjacent the capping layer. The light extraction film includes a substrate, a layer of nanostructures applied to the substrate, and a backfill layer disposed over the nanostructures and adjacent the capping layer, the backfill layer having an index of refraction greater than the index of refraction of the nanostructures. In one particular embodiment, the substrate includes a material substantially transparent to light emitted by the OLED device, such that light emitted by the OLED device is capable of passing through the backplane and through the substrate. In another particular embodiment, the substrate includes a material substantially reflective to light emitted by the OLED device, such that light emitted by the OLED device is capable of passing through the backplane. In yet another particular embodiment, the substrate includes a material substantially absorptive to light emitted by the OLED device such that light emitted by the OLED device is capable of passing through the backplane.

In another aspect, the present disclosure provides an active matrix organic light emitting diode (AMOLED) device that includes an array of light emitting devices, each light emitting device having an organic light emitting diode (OLED) device having a top electrode and an opposing bottom electrode disposed on a backplane, wherein each of the top electrode, the opposing bottom electrode and the backplane are substantially transparent to light emitted by the OLED device; and a capping layer disposed immediately adjacent the top electrode. The AMOLED device further includes a light extraction film disposed over the array of light emitting devices, the light extraction film adjacent the capping layer. The light extraction film includes a substrate, a layer of nanostructures applied to the substrate, and a backfill layer disposed over the nanostructures and adjacent the capping layer, the backfill layer having an index of refraction greater than the index of refraction of the nanostructures. In one particular embodiment, the substrate includes a material substantially transparent to light emitted by the OLED device, such that light emitted by the OLED device is capable of passing through the backplane and through the substrate. In another particular embodiment, the substrate includes a material substantially reflective to light emitted by the OLED device, such that light emitted by the OLED device is capable of passing through the backplane. In yet another particular embodiment, the substrate includes a material substantially absorptive to light emitted by the OLED device such that light emitted by the OLED device is capable of passing through the backplane.

In yet another aspect, the present disclosure provides an image display device that includes a plurality of light emitting devices, each light emitting device having an organic light emitting diode (OLED) device having a top electrode and an opposing bottom electrode disposed on a backplane, wherein each of the top electrode, the opposing bottom electrode and the backplane are substantially transparent to light emitted by the OLED device; and a capping layer disposed immediately adjacent the top electrode. The image display device further includes a light extraction film disposed adjacent the capping layer; and an electronic circuit capable of activating each of the light emitting devices. The light extraction film includes a substrate, a layer of nanostructures applied to the substrate, and a backfill layer disposed over the nanostructures and adjacent the capping layer, the backfill layer having an index of refraction greater than the index of refraction of the nanostructures. In one particular embodiment, the substrate includes a material substantially transparent to light emitted by the OLED device, such that light emitted by the OLED device is capable of passing through the backplane and through the substrate. In another particular embodiment, the substrate includes a material substantially reflective to light emitted by the OLED device, such that light emitted by the OLED device is capable of passing through the backplane. In yet another particular embodiment, the substrate includes a material substantially absorptive to light emitted by the OLED device such that light emitted by the OLED device is capable of passing through the backplane.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
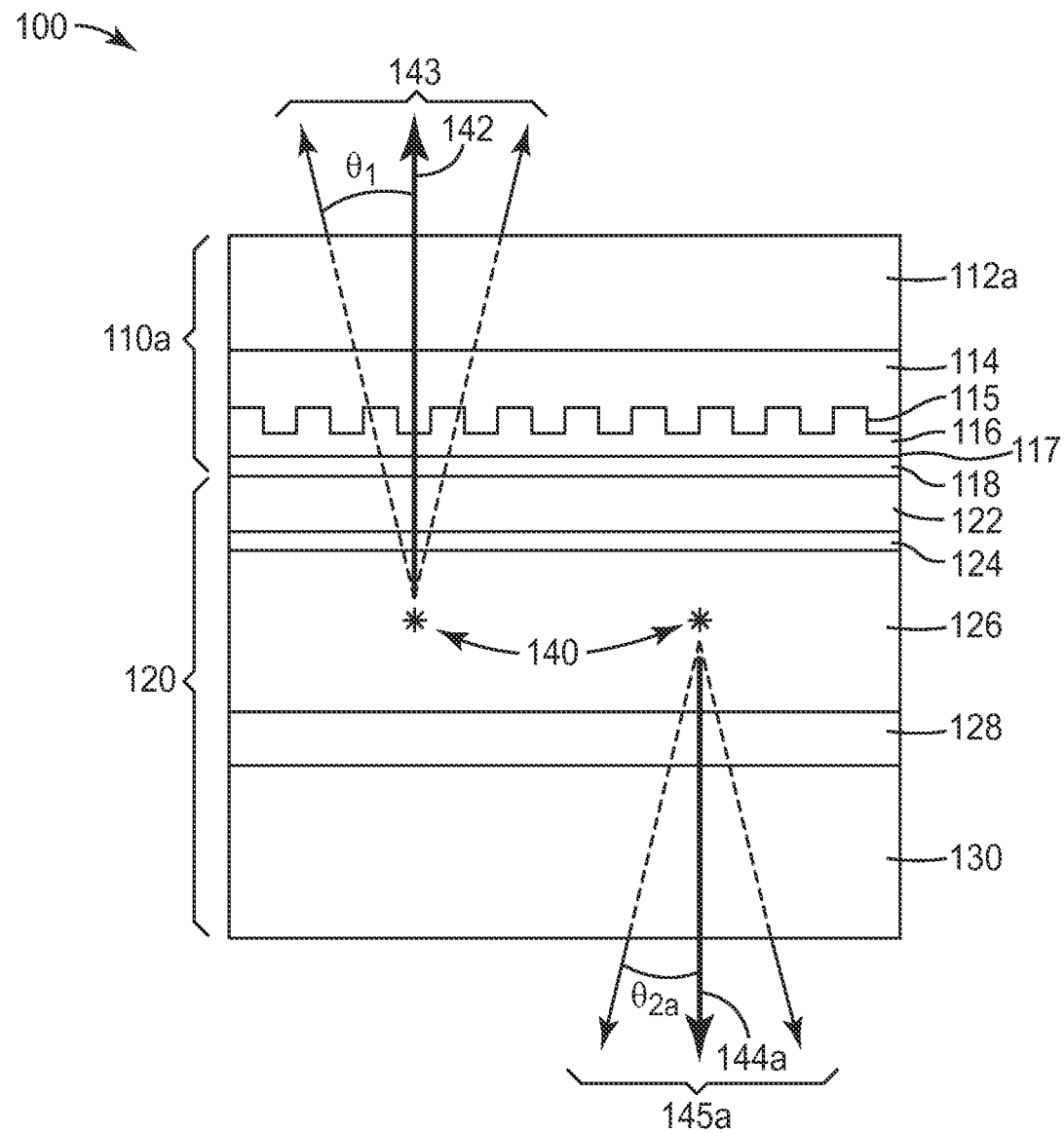
FIG. 1A shows a cross-sectional schematic of a light emitting device including a transparent light extraction film.

The present disclosure describes novel light emitting devices including AMOLED displays, based on transparent OLED architecture, where a laminated nanostructured light extraction film can produce axial and integrated optical gains as well as improved angular luminance and color. Generally, the transparent AMOLED displays with laminated sub-micron extractors include: (a) an extractor on a transparent substrate for light outcoupling on both sides of the transparent device; or (b) an extractor on a reflective film for providing light outcoupling off the bottom side of the bottom-emissive (BE) AMOLED; or (c) an extractor on a light absorbing film for providing outcoupling off the bottom side of the BE AMOLED combined with improved ambient contrast.

Embodiments of the present disclosure relate to light extraction films and uses of them for OLED devices. Examples of light extraction films are described in U.S. Pat. Application Publication Nos. 2009/0015757 and 2009/0015142, and also in co-pending U.S. patent application Ser. No. 13/218,610.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

OLED external efficiency is a parameter to be considered for all OLED applications in the range between high-resolution displays and lighting, since it affects such important device characteristics as power consumption, luminance and lifetime. It has been demonstrated that OLED external efficiency can be limited by optical losses within the OLED stack itself (for example, waveguiding mode within high-index organic layers and indium tin oxide), within intermediate-refractive index substrates, and due to exciton quenching at the electrode (cathode or anode) metal's surface plasmon polaritons. In a device with a maximum possible internal efficiency, about 75-80% of this efficiency can be dissipated internally due to above-mentioned losses. Additionally, in display applications, more than 50% of the light can be lost in a circular polarizer used for improving, for example, Active Matrix Organic Light Emitting Diode (AMOLED) ambient contrast. The primary approach to addressing improvement of light extraction implemented in current AMOLED displays involves a strong optical microcavity, which enables some (usually about 1.5x) axial and total gains, yet can induce significant luminance and color angular problems.

The present disclosure describes techniques for improving the optical design of light emitting devices including bottom-emissive and transparent AMOLED displays, image display devices, and can also apply to top-emissive (TE) AMOLED devices and displays as well. In some cases, the techniques can also apply to transparent or bottom-emissive OLED lighting.

In one particular embodiment, the present disclosure provides a transparent AMOLED display with a light extraction film optically coupled (for example, laminated) to only one (for example, the top) surface of the OLED stack, and producing a similar light extraction effect and improvements in luminance angularity on both sides (that is, the bottom and the top) of the device.

In one particular embodiment, the present disclosure provides a bottom-emissive AMOLED display with improved light extraction/wide angle performance obtained by fabrication of an extraction film coated onto a mirror film substrate (for example, a multilayer optical film such as Enhanced Specular Reflective (ESR) film, or surface mirror including silver, gold, aluminum or metal alloys), and optical coupling (for example, by lamination) of such a film onto a top side of the transparent OLED stack.

In one particular embodiment, the present disclosure provides a bottom-emissive AMOLED display with improved light extraction/wide angle performance and improved ambient contrast obtained by fabrication of an extraction film disposed on a light absorbing substrate, such as a black/absorbing film substrate, and optical coupling (for example, by lamination) of such a film onto a top side of the transparent OLED stack.

OLED luminance enhancement by a factor of 1.5-2.2× has been demonstrated with a nanostructured, that is submicron, OLED light extractors, for example in U.S. Pat. Application Publication Nos. 2009/0015757 and 2009/0015142. However, much of the work reported in the open literature describe building OLED stacks on top of a nanostructured extractor. The concept of building a bottom emissive OLED display on such a film is attractive; however as yet unobtainable. Bottom emissive (BE) OLED displays typically require building a low-temperature poly-Si (LTPS) backplane on top of the extractor structure. This poses an obstacle to using such nanostructures in BE devices, because processes employed in backplane manufacturing are both demanding and aggressive. For example, the thermal and chemical stresses imposed on the substrate during backplane manufacturing can impact the sensitive substrate quality. In some cases, temperatures as high as 350-600° C. may be used to process Si for LTPS backplanes, which can render the application of the extractor film prior to backplane manufacturing extremely difficult, if not nearly impossible.

Significant optical gains and improvements in luminance/color angular uniformity have also been demonstrated when an extractor film is optically coupled to a top-emissive (TE) microcavity OLED via a high refractive index optical coupling layer, for example as shown in co-pending U.S. Provisional Patent Application entitled MICROCAVITY OLED LIGHT EXTRACTION Ser. No 61/691,949, filed on an even date herewith. The laminated extraction film concept is appealing since application of the extractor onto the microcavity OLED takes place after the most aggressive and sensitive display fabrication steps are complete.

FIG. 1A shows a cross-sectional schematic of a light emitting device 100, according to one aspect of the disclosure. In FIG. 1, an extractor is provided on a transparent substrate for light outcoupling on both sides of a transparent device. Light emitting device 100 includes a transparent light extraction film 110a disposed adjacent a capping layer 122. The capping layer 122 is disposed immediately adjacent a top electrode 124 of an OLED device 120. In one particular embodiment, light emitting device 100 can be a novel portion of an AMOLED device, or part of an image display device including drive electronics, as known to one of skill in the art. Transparent light extraction film 110a can include a substantially transparent substrate 112a (flexible or rigid), a nanostructured layer 114 including nanostructures 115, and a backfill layer 116 that can form a substantially planar surface 117 over nanostructures 115. The backfill layer 116 includes a material that has an index of refraction that is greater than the index of refraction of the nanostructured layer 114. The term "substantially planar surface" means that the backfill layer planarizes the underlying layer, although slight surface variations may be present in the substantially planar surface. When the planar surface of the backfill layer is placed against the light output surface of the OLED device 120, the nanostructures at least partially enhance light output from the OLED device 120. The planar surface 117 can be placed directly against the OLED light output surface or through another layer between the planar surface and light output surface.

OLED device 120 includes an OLED having a bottom electrode 128, electroluminescent organic material 126, and a top electrode 124, and can further be disposed on a substantially transparent backplane 130. Top electrode 124 and bottom electrode 128 can be a transparent cathode and a transparent anode, respectively, as known to one of ordinary skill in the art. Light generated in the electroluminescent organic material 126 can escape the OLED device 120 from both the top and bottom electrode 124, 128. In some cases, the top electrode can be a transparent electrode comprising a metal oxide such as a transparent conductive oxide having a thickness less than about 500 nm, or less than about 300 nm, or less than about 100 nm, or less than about 50 nm or even less than about 30 nm. OLED device 120 further includes a capping layer 122 disposed immediately adjacent the top electrode 124. When the capping layer 122 has a sufficiently high index of refraction, generally at least greater than the electroluminescent organic material 126, the efficiency of light extracted from the OLED device 120 can be improved.

In some cases, the capping layer can have an index of refraction greater than about 1.8, or greater than about 1.9, or greater than about 2.0 or more. As used herein, refractive index refers to the index of refraction for light having a wavelength of 550 nm, unless otherwise indicated. In one particular embodiment, the capping layer comprises molybdenum oxide (MoO3), zinc selenide (ZnSe), silicon nitride (SiNx), indium tin oxide (ITO), or a combination thereof. In one particular embodiment, a capping layer comprising zinc selenide can be preferred. In some cases, the capping layer comprises a thickness between about 60 nm and 400 nm. The capping layer thickness may be optimized, if desired, to provide for the most efficient coupling of the waveguided loss modes inside the OLED stack, to the extractor. While the capping layer has the above-mentioned optical function, it also in some cases can provide an additional protection of the OLED organic materials from the extraction film components, for example, from the optical coupling layer/ adhesive used to apply the extraction film onto an OLED device. Thus, it may be desirable that the capping layer exhibits some level of barrier properties towards the components of the OLED light extraction film.

The transparent light extraction film 110a is typically made as a separate film to be applied to an OLED device 120. For example, an optical coupling layer 118 can be used to optically couple the transparent light extraction film 110a to a light output surface of an OLED device 120. Optical coupling layer 118 can be applied to the transparent light extraction film 110a, the OLED device 120, or both, and it can be implemented with an adhesive to facilitate application of the transparent light extraction film 110a to the OLED device 120. As an alternative to a separate optical coupling layer 118, the backfill layer 116 may be comprised of a high index adhesive, so that the optical and planarizing functions of the backfill layer 116, and the adhering function of the optical coupling layer 118, are performed by the same layer. Examples of optical coupling layers and processes for using them to laminate light extraction films to OLED devices are described, for example, in U.S. patent application Ser. No. 13/050,324, entitled "OLED Light Extraction Films Having Nanoparticles and Periodic Structures," and filed Mar. 17, 2011.

The nanostructures 115 for transparent light extraction film 110a can be particulate nanostructures, non-particulate nanostructures, or a combination thereof. In some cases, the non-particulate nanostructures can comprise an engineered nanostructure having an engineered nanoscale pattern. The nanostructures 115 can be formed integrally with the substrate or in a layer applied to the substrate. For example, the nanostructures can be formed on the substrate by applying to the substrate a low-index material and subsequently patterning the material. In some cases, the nanostructures can be embossed into a surface of the substantially transparent substrate 112. Engineered nanostructures are structures having at least one dimension, such as width, less than 1 micron. Engineered nanostructures are not individual particles but may be composed of nanoparticles forming the engineered nanostructures where the nanoparticles are significantly smaller than the overall size of the engineered structures.

The engineered nanostructures for transparent light extraction film 110a can be one-dimensional (1D), meaning they are periodic in only one dimension, that is, nearest-neighbor features are spaced equally in one direction along the surface, but not along the orthogonal direction. In the case of 1D periodic nanostructures, the spacing between adjacent periodic features is less than 1 micron. One-dimensional structures include, for example, continuous or elongated prisms or ridges, or linear gratings. In some cases, the nanostructured layer 114 can comprise nanostructures 115 having a variable pitch. In one particular embodiment, the nanostructured layer 114 can comprise nanostructures having a pitch of about 400 nm, about 500 nm, about 600 nm, or a combination thereof.

The engineered nanostructures for transparent light extraction film 110a can also be two-dimensional (2D), meaning they are periodic in two dimensions, that is, nearest neighbor features are spaced equally in two different directions along the surface. Examples of engineered nanostructures can be found, for example, in U.S. patent application Ser. No. 13/218,610, filed on Aug. 26, 2011. In the case of 2D nanostructures, the spacing in both directions is less than 1 micron. Note that the spacing in the two different directions may be different. Two-dimensional structures include, for example, lenslets, pyramids, trapezoids, round or square shaped posts, or photonic crystal structures. Other examples of two-dimensional structures include curved sided cone structures as described in U.S. Pat. Application Publication No. 2010/0128351.

Materials for the substrates, nanostructures, and backfill layers for transparent light extraction film 110a are provided in the published patent applications identified above. For example, the substrate can be implemented with glass, PET, polyimides, TAC, PC, polyurethane, PVC, or flexible glass. Processes for making transparent light extraction film 110a are also provided in the published patent applications identified above. Optionally, the substrate can be implemented with a barrier film to protect a device incorporating the light extraction film from moisture or oxygen. Examples of barrier films are disclosed in U.S. Pat. Application Publication No. 2007/0020451 and U.S. Pat. No. 7,468,211.

When a voltage is applied across the top electrode 124 and the bottom electrode 128 of the light emitting device 100, electrons and holes are injected from their respective electrodes and recombine in the electroluminescent organic material 126 through the intermediate formation of emissive excitons 140. The emissive excitons 140 generate a top emitted light ray 142 that exits the light emitting device 100 by passing through the substantially transparent substrate 112a, and a bottom emitted light ray 144a that exits the light emitting device 100 by passing through the substantially transparent backplane 130. The top emitted light ray 142 is included within a top light beam 143 that includes light within a top half-angle $\theta 1$, and the bottom emitted light ray 144a is included within a bottom light beam 145a that includes light within a bottom half-angle $\theta 2a$. The presence of the transparent light extraction film 110a may enhance or otherwise modify the angularity of the light emitting device (that is, the magnitude of the top half-angle $\theta 1$ spread of the top light beam 143, and the bottom half angle $\theta 2a$ spread of the bottom light beam 145a), and also the brightness (that is, the magnitude of the top light beam 143 and the bottom light beam 145a). In some cases, the top half-angle $\theta 1$ can be equivalent to the bottom half angle $\theta 2a$, and/or the magnitude of the top light beam 143 can be equivalent to the magnitude of the bottom light beam 145a, although this is not necessarily so.

Figure 1B:
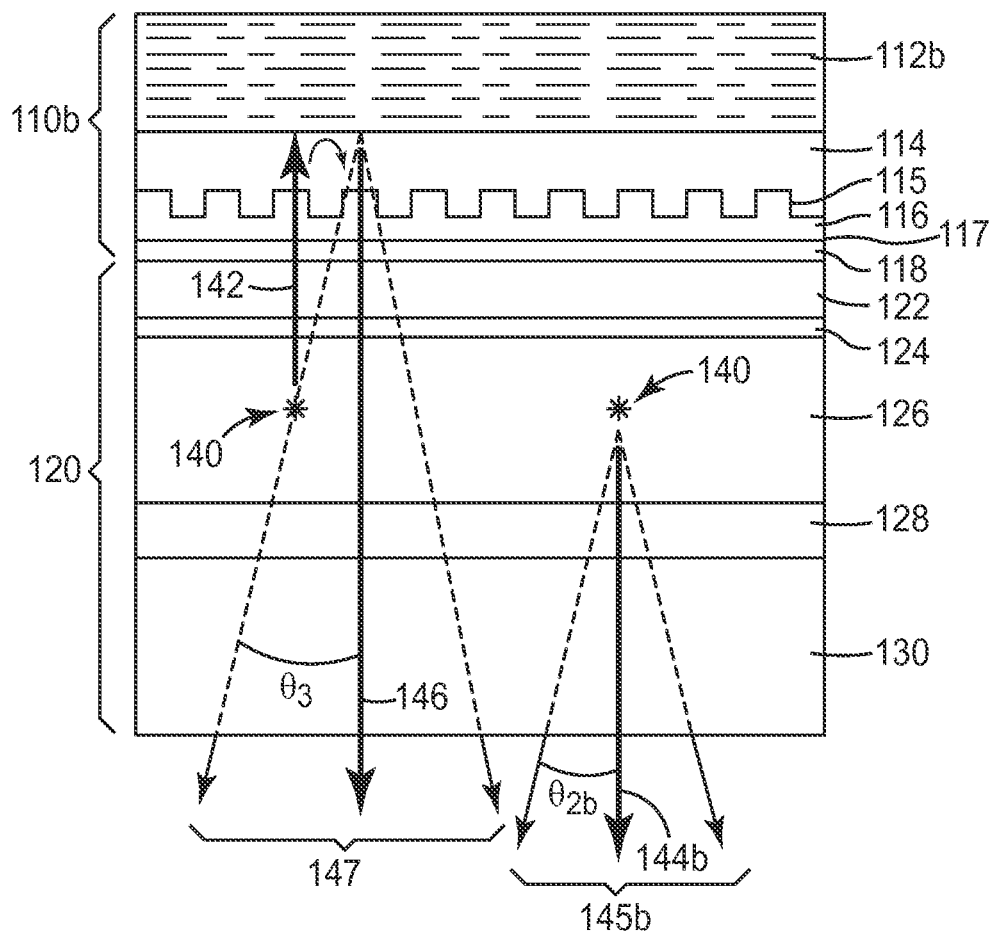
FIG. 1B shows a cross-sectional schematic of a light emitting device including a reflective light extraction film.

FIG. 1B shows a cross-sectional schematic of a light emitting device 101, according to one aspect of the disclosure. In FIG. 1B, an extractor on a surface reflector provides light outcoupling from the bottom side of the device; the reflector causes light to be emitted only from the bottom of the device, as described elsewhere. Each of the elements 114-130 shown in FIG. 1B correspond to like-numbered elements shown in FIG. 1A, which have been described previously. For example, substantially transparent backplane 130 in FIG. 1B corresponds to substantially transparent backplane 130 in FIG. 1A, and so on.

Most typical OLED architectures, both top and bottom-emissive, include a reflective electrode responsible not only for charge injection but also for reflection or re-direction of the light that is emitted by the OLED towards such reflective electrode. This usually leads to improved efficiency through the second, transparent, electrode. The light emitting device 101 shown in FIG. 1B provides such light reflection or re-direction by providing a reflective film on top of the device. Such a device with a film reflector is expected, and has been demonstrated, to be as efficient as conventional OLEDs with metallic reflective electrodes. Moreover, since the device shown in FIG. 1B includes a light extraction nanostructure, such a device may have improved efficiency compared to conventional OLEDs.

Light emitting device 101 includes a reflective light extraction film 110b, in contrast to the light emitting device 100 shown in FIG. 1A, which includes a transparent light extraction film 110a. Reflective light extraction film 110b includes a reflective substrate 112b, whereas transparent light extraction film 110a includes a substantially transparent substrate 112a. All other components of light emitting device 101 shown in FIG. 1B are identical to like components of light emitting device 100 shown in FIG. 1A.

Reflective substrate 112b can comprise any suitably light reflective material including, for example: bulk and surface deposited metals and metal alloys such as silver, aluminum, and the like; multilayer dielectric reflectors including both inorganic and organic multilayer films such as metal oxide stacks, and organic multilayer films such as multilayer optical films like Vikuiti™ ESR film available from 3M Company; and combinations thereof. In some cases, nanostructures 115 can be directly embossed into a surface of the reflective substrate 112b.

When a voltage is applied across the top electrode 124 and the bottom electrode 128 of the light emitting device 101, electrons and holes are injected from their respective electrodes and recombine in the electroluminescent organic material 126 through the intermediate formation of emissive excitons 140. The emissive excitons 140 generate a top emitted light ray 142 that is directed toward the top electrode 124, and a bottom emitted light ray 144b that is directed toward the bottom electrode 128 and through the transparent backplane 130. The top emitted light ray 142 reflects from reflective substrate 112b as a reflected top emitted light ray 146 that is also directed through the transparent backplane 130.

The reflected top emitted light ray 146 is included within a reflected top light beam 147 that includes light within a reflected top half-angle $\theta 3$, and the bottom emitted light ray 144b is included within a bottom light beam 145b that includes light within a bottom half-angle $\theta 2b$. The presence of the reflective light extraction film 110b may enhance or otherwise modify the angularity of the light emitting device (that is, the magnitude of the reflected top half-angle $\theta 3$ spread of the reflected top light beam 147, and the bottom half angle $\theta 2b$ spread of the bottom light beam 145b), and also the brightness (that is, the magnitude of the reflected top light beam 147 and the bottom light beam 145b). In some cases, the reflected top half-angle $\theta 3$ can be equivalent to the bottom half angle $\theta 2b$, and/or the magnitude of the reflected top light beam 147 can be equivalent to the magnitude of the bottom light beam 145b, although this is not necessarily so.

Figure 1C:
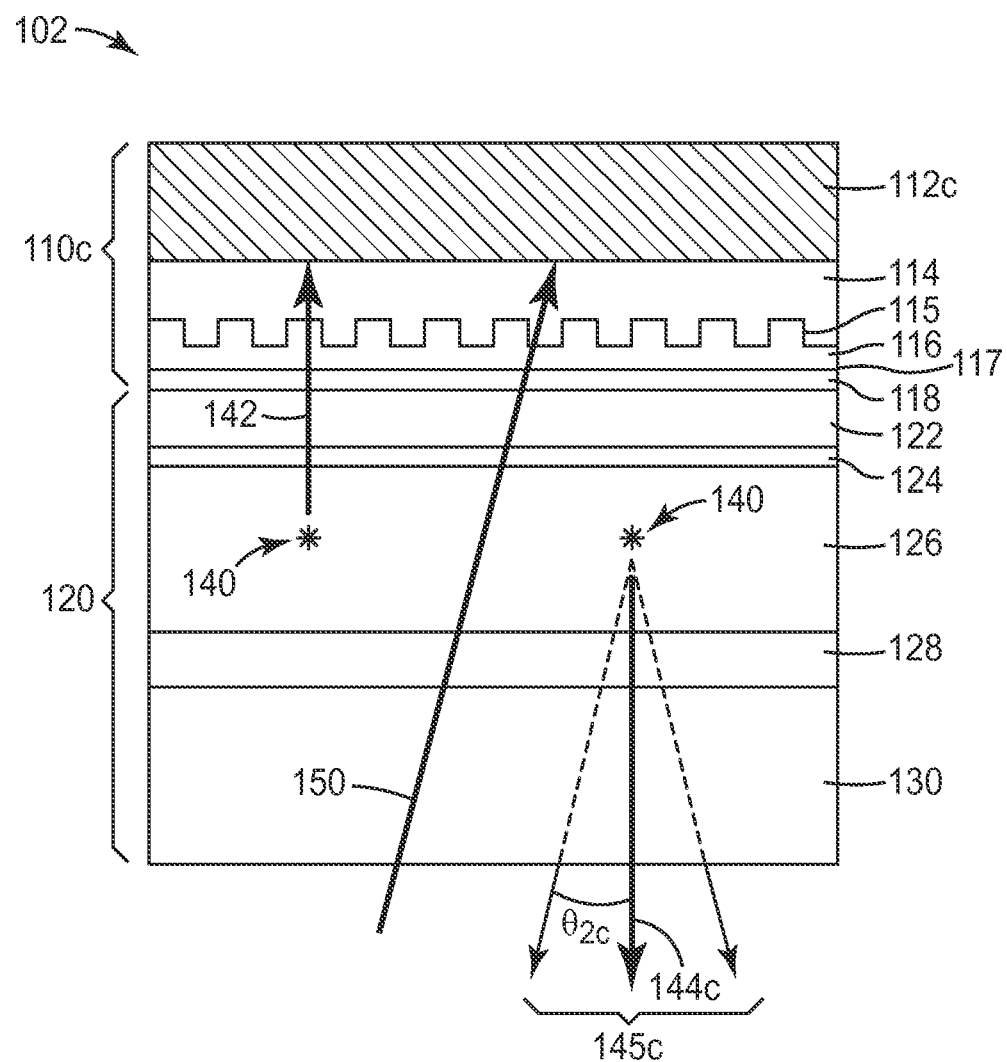
FIG. 1C shows a cross-sectional schematic of a light emitting device including an absorptive light extraction film.

FIG. 1C shows a cross-sectional schematic of a light emitting device 102, according to one aspect of the disclosure. In FIG. 1C, an extractor on an absorptive film provides outcoupling from the bottom side of the device, combined with improved ambient contrast; the absorber causes light to be emitted only from the bottom of the device, as described elsewhere. Each of the elements 114-130 shown in FIG. 1C correspond to like-numbered elements shown in FIGS. 1A and 1B, which have been described previously. For example, substantially transparent backplane 130 in FIG. 1C corresponds to substantially transparent backplane 130 in FIGS. 1A and 1B, and so on.

The use of either black or light absorbing electrodes in OLED displays in order to improve ambient contrast of the device have been described elsewhere. However, such devices typically suffer from significant additional light losses due to absorption of the OLED emitted light by such electrode. The light emitting device 102 shown in FIG. 1C can produce improved light efficiency in comparison to devices with absorbing electrodes, in part because a light extraction nanostructure is incorporated into the optical stack comprising the transparent OLED device and light extraction film on an absorbing substrate. An extractor laminated on either facet of the OLED device leads to improved light outcoupling through the opposite electrode as well.

Light emitting device 102 includes an absorptive light extraction film 110c, in contrast to the light emitting device 100 shown in FIG. 1A, which includes a transparent light extraction film 110a, or the light emitting device 101 shown in FIG. 1B, which includes a reflective light extraction film 110b. Absorptive light extraction film 110c includes a light absorbing substrate 112c, whereas transparent light extraction film 110a includes a substantially transparent substrate 112a, and reflective light extraction film 110b includes a reflective substrate 112b. All other components of light emitting device 102 shown in FIG. 1C are identical to like components of light emitting device 100 and 101 shown in FIGS. 1A and 1B, respectively.

Light absorbing substrate 112c can comprise any suitably light absorbing material, in particular visible light absorbing materials including, for example: pigments and/or dyes both coated on a substrate and dispersed throughout the substrate; microstructured and/or microtextured light absorptive surface coatings; and combinations thereof. In some cases, nanostructures 115 can be directly embossed into a surface of the light absorbing substrate 112c.

When a voltage is applied across the top electrode 124 and the bottom electrode 128 of the light emitting device 102, electrons and holes are injected from their respective electrodes and recombine in the electroluminescent organic material 126 through the intermediate formation of emissive excitons 140. The emissive excitons 140 generate a top emitted light ray 142 that is directed toward the top electrode 124, and a bottom emitted light ray 144c that is directed toward the bottom electrode 128 and through the transparent backplane 130. The top emitted light ray 142 is absorbed by the light absorbing substrate 112c.

The bottom emitted light ray 144c is included within a bottom light beam 145c that includes light within a bottom half-angle $\theta 2c$. The presence of the absorptive light extraction film 110c may enhance or otherwise modify the angularity of the light emitting device (that is, the magnitude of the bottom half angle $\theta 2c$ spread of the bottom light beam 145c), and also the brightness (that is, the magnitude of the bottom light beam 145b). The presence of the absorptive light extraction film 110c further enhances the contrast of the light emitting device 102 by absorbing any ambient light 150 that enters through the substantially transparent backplane 130.

EXAMPLES

All parts, percentages, ratios, etc. in the examples are by weight, unless noted otherwise. Solvents and other reagents used were obtained from Sigma-Aldrich Chemical Company; Milwaukee, Wis. unless specified differently.

| Materials | | |
|---|---|---|
| Abbreviation/ product name | Description | Available from |
| 3-mercaptopropyl trimethoxysilane | Chain Transfer Agent, 95% | Alfa Aesar, Ward Hill, MA |

-continued

| Materials | | |
|---|---|---|
| Abbreviation/ product name | Description | Available from |
| IRGACURE 184 | Photoinitiator | Ciba Specialty Chemicals, Tarrytown, NY |
| $MoO_3$ | PURATRONIC $MoO_3$, 99.9995% metals basis | Alfa Aesar, Ward Hill, MA |
| Nagase XNR5516Z-B1 | UV curable epoxy resin | Nagase chemteX Corp., Japan |
| PHOTOMER 6210 | aliphatic urethane diacrylate | Cognis Corporation, Cincinnati, OH |
| SOLPLUS D510 | polyester-polyamine copolymer | Lubrizol, Cleveland, OH |
| SR238 | 1,6 hexanediol diacrylate | Sartomer Company, Exton, PA |
| SR833S | difunctional acrylate monomer | Sartomer Company, Exton, PA |

Preparative Examples

Preparation of D510 Stabilized 50 nm $TiO_2$ Nanoparticle Dispersions

A $TiO_2$ nanoparticle dispersion with an approximately 52% wt of $TiO_2$ was prepared using a milling process in the presence of SOLPLUS D510 and 1-methoxy-2-propanol. The SOLPLUS D510 was added in an amount of 25% wt based on $TiO_2$ weight. The mixture was premixed using a DISPERMAT mixer (Paul N. Gardner Company, Inc., Pompano Beach, Fla.) for 10 minutes and then a NETZSCH MiniCer Mill (NETZSCH Premier Technologies, LLC., Exton, Pa.) was used with the following conditions: 4300 rpm, 0.2 mm YTZ milling media, and 250 ml/min flow rate. After 1 hour of milling, a white paste-like $TiO_2$ dispersion in 1-methoxy-2-propanol was obtained. The particle size was determined to be 50 nm (Z-average size) using a Malvern Instruments ZETASIZER Nano ZS (Malvern Instruments Inc, Westborough, Mass.).

Preparation of High Index Backfill Solution (HI-BF)

20 g of D510 stabilized 50 nm $TiO_2$ solution, 2.6 g of SR833S, 0.06 g of IRGACURE 184, 25.6 g of 1-methoxy-2-propanol, 38.4 g of 2-butanone were mixed together to form a homogenous high index backfill solution.

Fabrication of Nanostructured Film with 400 nm Pitch

A 400 nm "sawtooth" grating film was fabricated by first making a multi-tipped diamond tool as described in U.S. Pat. No. 7,140,812 (using a synthetic single crystal diamond, Sumitomo Diamond, Japan).

The diamond tool was then used to make a copper micro-replication roll which was then used to make 400 nm 1D structures on a PET film in a continuous cast and cure process utilizing a polymerizable resin made by mixing 0.5% (2,4,6 trimethyl benzoyl) diphenyl phosphine oxide into a 75:25 blend of PHOTOMER 6210 and SR238.

HI-BF solution was coated onto the 400 nm pitch 1D structured film using a roll to roll coating process with a web speed of 4.5 m/min (15 ft/min) and a dispersion delivery rate of 5.1 cc/min. The coating was dried in air at room temperature, then subsequently further dried at 82° C. (180° F.) and then cured using a Fusion UV-Systems Inc. Light-Hammer 6 UV (Gaithersburg, Md.) processor equipped with an H-bulb, operating under nitrogen atmosphere at 75% lamp power at a line speed of 4.5 m/min (15 ft/min).

Example 1

Top Emissive (TE) OLED test coupons were built using standard thermal deposition in a vacuum system at base pressure of about $10^{-6}$ Torr. A substrate was fabricated on polished float glass with a 0.5 μm thick photoresist coating and with 80 nm ITO coatings patterned to produce four 5×5 mm pixels in a square arrangement. A pixel defining layer (PDL) was applied to reduce the square size to 4×4 mm and provide clearly defined pixel edges. The following structure was built:

Substrate/80 nm ITO bottom electrode (cathode)/20 nm EIL/25 nm ETL/30 nm EML/10 nm HTL2/165 nm HTL1/100 nm HIL/80 nm ITO top electrode (anode)/ 200 nm MoO3 capping layer (CPL)

where HIL, HTL, EML and ETL stand, respectively, for hole-injection, hole-transport, emissive and electron-transport layers. The top electrode was 80 nm ITO patterned via shadow masks to align with the substrate layer. A pixel defining layer (PDL) was applied to reduce the square size to 4×4 mm and provide clearly defined pixel edges. The capping layer (CPL) was 200 nm thick $MoO_3$. Typical values of refractive index cited in published literature for $MoO_3$ range from 1.7-1.9. The $MoO_3$ was deposited on a substrate kept at room temperature, which results in a refractive index of approximately 1.71 measured at a wavelength at 600 nm, as reported in "Optical characterization of $MoO_3$ thin films produced by continuous wave $CO_2$ laser-assisted evaporation", Cárdenas et al., *Thin Solid Films*, Vol. 478, Issues 1-2, Pages 146-151, May 2005.

Following device fabrication and prior to encapsulation, 400 nm pitch 1D-symmetric extractor backfilled with a high refractive index described under "Fabrication of nanostructured film with 400 nm pitch" was applied onto two pixels out of four on each test coupon, using an optical coupling layer prepared as described in Example 7 of U.S. Provisional application Ser. No. 61/604,169, except that in the synthesis of Polymer-II, 2.0 g of 3-mercaptopropyl trimethoxysilane was used instead of 3.7 g. The optical coupling layer had a refractive index of about 1.7. The extractor lamination was conducted under inert ($N_2$) atmosphere and was followed by protecting under a glass lid attached by applying Nagase XNR5516Z-B1 UV-curable epoxy around the perimeter of the lid and cured with a UV-A light source at 16 Joules/cm$^2$ for 400 seconds.

Electrical and optical performance of the fabricated devices were evaluated using a set of standard OLED measurement techniques, including luminance-current-voltage (LIV) measurements using a PR650 camera (Photo Research, Inc., Chatsworth, Calif.) and Keithley 2400 Sourcemeter (Keithley Instrumemts, Inc., Cleveland, Ohio), angular luminance and electroluminescence spectra measurements using an AUTRONIC Conoscope (AUTRONIC-MELCHERS GmbH, Karlsruhe, Germany), and goniometric measurements using the PR650 camera. The pixels without nanostructures were tested as controls. Optical properties of the transparent devices were evaluated on both the top side (lamination side) and the bottom side of the devices.

Figure 2:
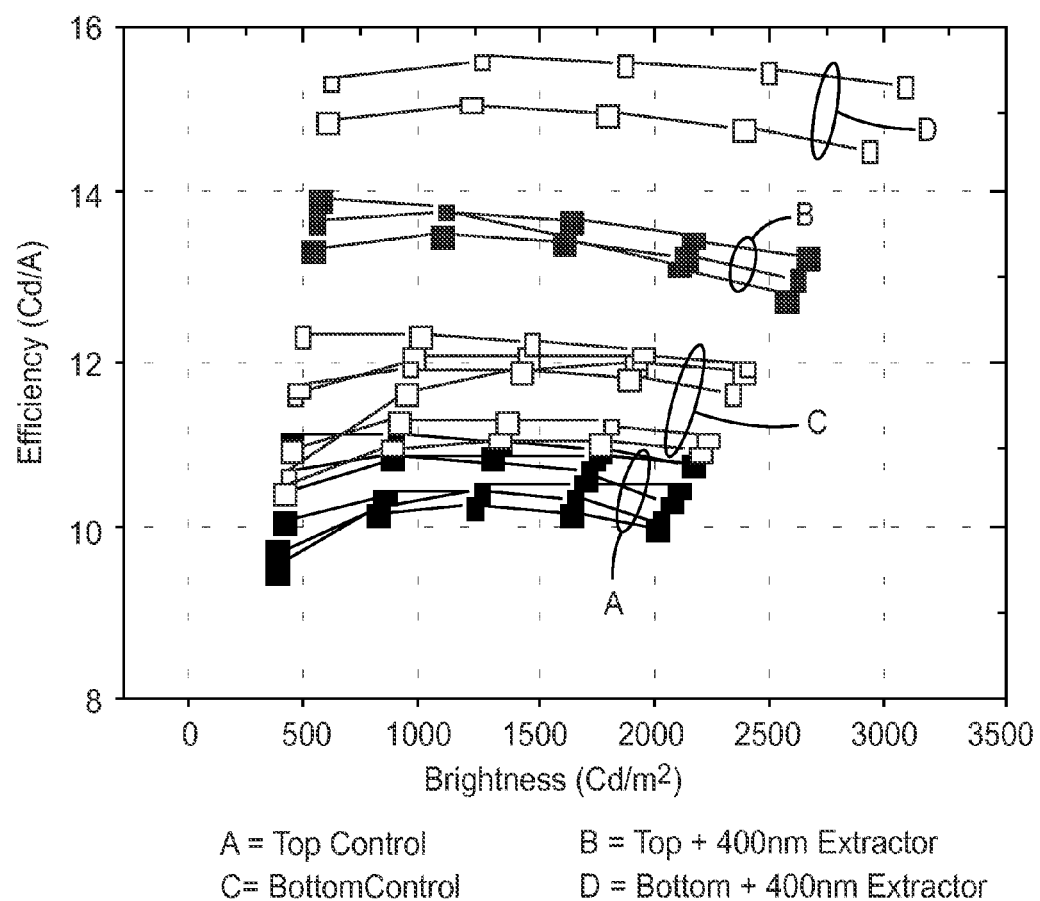
FIG. 2 shows efficiency vs brightness for control and extractor-laminated devices.

FIG. 2 shows typical axial efficiency—luminance plots for both top- and bottom-emission sides of the transparent control and laminated devices. In FIG. 2, the performance of the top surface emission control is labeled "A", and top surface emission laminated with the extractor is labeled "B"; bottom surface emission control is labeled "C", and bottom surface emission laminated with the extractor is labeled "D". An axial optical gain of about 1.3× was observed on both the lamination (top) side and the bottom side of the devices. Conoscopic images of the devices showed axial gains of about 1.3× on each side of the devices, in agreement with the axial LIV tests, and showed integrated gains of up to 1.4× on each side. Very similar luminance far-field patterns were observed for the top and bottom of the devices indicating that the laminated extractor became a part of the same optical stack influencing light extracted in both directions.

Example 2

Transparent OLED devices were built and evaluated according to the procedure described in Example 1 except that immediately prior to glass encapsulation, a 200 nm thick Ag film was vacuum-deposited onto all four pixels (both control pixels and pixels with laminated nanostructured extractor film) to redirect light solely towards the bottom-emission (BE) side.

Figure 3:
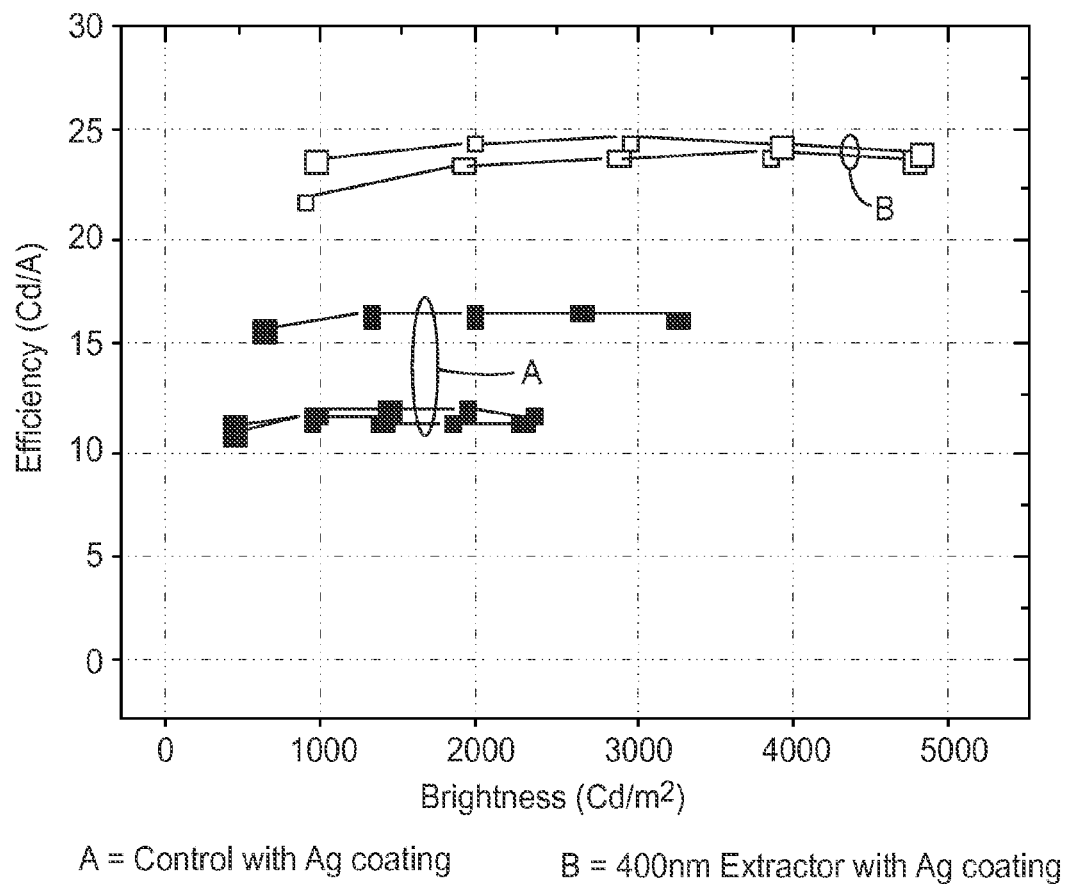
FIG. 3 shows efficiency vs brightness for control and extractor-laminated devices.

FIG. 3 shows axial efficiency—luminance plots for the BE devices where it can be seen that significant axial gains (near 2×) were obtained in the devices having the nanostructured extractor. In FIG. 3, the performance of the control with only the Ag coating is labeled "A", and the laminated sample with the Ag coating and laminated extractor is labeled "B". Conoscopic luminance far-field images of the control devices showed a fairly typical, broad luminance distribution while the luminance pattern changed to a characteristic forward-directed band for devices incorporating the nanostructured extractor. Approximately 2× axial and integrated optical gains were observed.

Example 3

Preparation of a Reflective Extraction Film

A PET film with 400 nm structures was prepared as described in "Fabrication of nanostructured film with 400 nm pitch" except that no backfill was applied. The film was plasma treated using a commercial batch plasma system (Plasma-Therm Model 3032 available from Plasma-Therm, St. Petersburg, Fla.) configured for reactive ion etching (RIE) with a 0.66 m (26 inch) lower powered electrode and central gas pumping. The chamber was pumped by a roots blower (Edwards Model EH1200 available from Edwards US, Sanborn, N.Y.) backed by a dry mechanical pump (Edwards Model iQDP80 available from Edwards US, Sanborn, N.Y.). RF power was delivered by a 3 kW, 13.56 MHz solid-state generator (RFPP Model RF30S available from RF Power Products, Inc., Voorhees, N.J.) through an impedance matching network. The system had a nominal base pressure of 5 mTorr. The flow rates of the gases were controlled by MKS flow controllers (MKS Instruments, Andover, Mass.). Samples were placed on the lowered powered electrode of the batch plasma apparatus. A surface preparation step was performed by flowing $O_2$ at a flow rate of 500 standard $cm^3$/min, plasma power of 200 watts for 30 seconds. The plasma treatment was done by flowing tetramethylsilane gas at a flow rate of 150 standard $cm^3$/min, plasma power of 200 watts for 120 seconds. The pressure during the deposition was approximately 20 mTorr. A post etch step was performed by flowing $O_2$ at a flow rate of 500 standard $cm^3$/min, plasma power of 300 watts for 20 seconds. After the plasma treatment was completed, the chamber was vented to atmosphere and the samples were removed.

A sheet of ESR (Enhanced Specular Reflector, 3M Company, St. Paul, Minn.) was primed with a solvent-borne polyester resin solution and dried in an oven at 80° C. for 3 minutes. The thickness of the prime layer was about 0.3 microns after drying. The primed sheet of ESR was laid on a metal plate on a hot plate set at 71° C. (160° F.) with the primed side facing upwards. The plasma treated nanostructuted PET film was laid over the ESR with structured side facing downwards. A piece of tape was used to attach both films to each other near their top edges. The PET film was lifted from the bottom edge and a thin bead of a UV curable multifunctional urethane acrylate resin was applied between the films near their top edges. The PET film was then set back on the ESR so the resin bead was in contact with both films. The metal plate and films were then passed through a heated laminator nip to spread the resin thinly and evenly between the PET film and the ESR. The laminator used was a GBC Catena 35 (GBC Document Finishing, Lincolnshire, Ill.), the nip rolls were set to 110° C. (230° F.), speed setting of "5" was used and the nip was closed to its tightest position (labeled "Heavy Gauge").

The resin was then cured by passing the metal plate and films on a belt-style curing station under a 79 W/cm (600 W/in) Fusion D-bulb at 100% power. Two passes were made at 12 m/min (40 ft/min) with the PET film above the ESR film. The tool was then peeled from the replicated ESR to expose the structure. The resulting nanostructure replicas on the ESR film were evaluated by SEM using a Hitachi S-4500 SEM instrument (Hitachi, Ltd., Japan). SEM images indicated a high fidelity of replication of the periodic nanostructures onto the ESR film, though the release was not optimal in this Example and some resin remained in the tool film.

Following are a list of embodiments of the present disclosure.

Item 1 is a light emitting device, comprising: an organic light emitting diode (OLED) device having a top electrode and an opposing bottom electrode disposed on a backplane, wherein each of the top electrode, the opposing bottom electrode and the backplane are substantially transparent to light emitted by the OLED device; a capping layer disposed immediately adjacent the top electrode; and a light extraction film disposed adjacent the capping layer, wherein the light extraction film comprises a substrate, a layer of nanostructures applied to the substrate, and a backfill layer disposed over the nanostructures and adjacent the capping layer, the backfill layer having an index of refraction greater than the index of refraction of the nanostructures.

Item 2 is the light emitting device of item 1, wherein the substrate comprises a material substantially transparent to light emitted by the OLED device, such that light emitted by the OLED device is capable of passing through the backplane and through the substrate.

Item 3 is the light emitting device of item 1 or item 2, wherein the substrate comprises a material substantially reflective to light emitted by the OLED device, such that light emitted by the OLED device is capable of passing through the backplane.

Item 4 is the light emitting device of item 3, wherein the material substantially reflective to light emitted by the OLED device comprises a reflective metal, an inorganic dielectric stack, a polymeric multilayer film, or a combination thereof.

Item 5 is the light emitting device of item 1 to item 4, wherein the substrate comprises a material substantially absorptive to light emitted by the OLED device such that light emitted by the OLED device is capable of passing through the backplane.

Item 6 is the light emitting device of item 5, wherein the material is also substantially absorptive to ambient visible light passing through the OLED device.

Item 7 is the light emitting device of item 1 to item 6, wherein the backfill layer comprises an adhesive for bonding the light extraction film to the capping layer.

Item 8 is the light emitting device of item 1 to item 7, further comprising an adhesive optical coupling layer disposed immediately adjacent the capping layer.

Item 9 is the light emitting device of item 1 to item 8, wherein the layer of nanostructures are applied to the substrate by embossing into a major surface of the substrate.

Item 10 is the light emitting device of item 1 to item 9, wherein the layer of nanostructures are applied to the substrate by patterning a coating.

Item 11 is the light emitting device of item 1 to item 10, wherein the layer of nanostructures comprise particulate nanostructures, non-particulate nanostructures, or a combination thereof.

Item 12 is the light emitting device of item 11, wherein the non-particulate nanostructures comprise an engineered nanoscale pattern.

Item 13 is the light emitting device of item 1 to item 12, wherein the backfill layer comprises a non-scattering nanoparticle filled polymer.

Item 14 is the light emitting device of item 1 to item 13, wherein at least one of the top electrode and the opposing bottom electrode comprises a transparent conductive oxide.

Item 15 is the light emitting device of item 14, wherein the transparent conductive oxide comprises a thickness less than about 300 nm.

Item 16 is the light emitting device of item 14, wherein the transparent conductive oxide comprises a thickness less than about 100 nm.

Item 17 is the light emitting device of item 14, wherein the transparent conductive oxide comprises a thickness less than about 30 nm.

Item 18 is the light emitting device of item 1 to item 17, wherein the capping layer comprises a material having a refractive index greater than about 1.7.

Item 19 is the light emitting device of item 1 to item 18, wherein the capping layer comprises molybdenum oxide, indium tin oxide, zinc selenide, or a combination thereof.

Item 20 is the light emitting device of item 1 to item 19, wherein the capping layer comprises a thickness between about 60 nm and 400 nm.

Item 21 is the light emitting device of item 1 to item 20, wherein the light extraction film comprises nanostructures having a variable pitch.

Item 22 is the light emitting device of item 1 to item 21, wherein the light extraction film comprises nanostructures having a pitch of about 400 nm, about 500 nm, about 600 nm, or a combination thereof.

Item 23 is an active matrix organic light emitting diode (AMOLED) device, comprising: an array of light emitting devices, each light emitting device comprising: an organic light emitting diode (OLED) device having a top electrode and an opposing bottom electrode disposed on a backplane, wherein each of the top electrode, the opposing bottom electrode and the backplane are substantially transparent to light emitted by the OLED device; a capping layer disposed immediately adjacent the top electrode; and a light extraction film disposed over the array of light emitting devices, the light extraction film adjacent the capping layer, wherein the light extraction film comprises a substrate, a layer of nanostructures applied to the substrate, and a backfill layer disposed over the nanostructures and adjacent the capping layer, the backfill layer having an index of refraction greater than the index of refraction of the nanostructures.

Item 24 is the AMOLED device of item 23, wherein the substrate comprises a material substantially transparent to light emitted by the OLED device, such that light emitted by the OLED device is capable of passing through the backplane and through the substrate.

Item 25 is the AMOLED device of item 23 or item 24, wherein the substrate comprises a material substantially reflective to light emitted by the OLED device, such that light emitted by the OLED device is capable of passing through the backplane.

Item 26 is the AMOLED device of item 25, wherein the material substantially reflective to light emitted by the OLED device comprises a reflective metal, an inorganic dielectric stack, a polymeric multilayer film, or a combination thereof.

Item 27 is the AMOLED device of item 23 to item 26, wherein the substrate comprises a material substantially absorptive to light emitted by the OLED device such that light emitted by the OLED device is capable of passing through the backplane.

Item 28 is the AMOLED device of item 27, wherein the material is also substantially absorptive to ambient visible light passing through the OLED device.

Item 29 is the AMOLED device of item 23 to item 26, wherein the backfill layer comprises an adhesive for bonding the light extraction film to the capping layer.

Item 30 is the AMOLED device of item 23 to item 26, further comprising an adhesive optical coupling layer disposed immediately adjacent the capping layer.

Item 31 is an image display device, comprising: a plurality of light emitting devices, each light emitting device comprising: an organic light emitting diode (OLED) device having a top electrode and an opposing bottom electrode disposed on a backplane, wherein each of the top electrode, the opposing bottom electrode and the backplane are substantially transparent to light emitted by the OLED device; a capping layer disposed immediately adjacent the top electrode; a light extraction film disposed adjacent the capping layer; and an electronic circuit capable of activating each of the light emitting devices, wherein the light extraction film comprises a substrate, a layer of nanostructures applied to the substrate, and a backfill layer disposed over the nanostructures and adjacent the capping layer, the backfill layer having an index of refraction greater than the index of refraction of the nanostructures.

Item 32 is the light emitting device of item 31, wherein the substrate comprises a material substantially transparent to light emitted by the OLED device, such that light emitted by the OLED device is capable of passing through the backplane and through the substrate.

Item 33 is the light emitting device of item 31 or item 32, wherein the substrate comprises a material substantially reflective to light emitted by the OLED device, such that light emitted by the OLED device is capable of passing through the backplane.

Item 34 is the light emitting device of item 33, wherein the material substantially reflective to light emitted by the OLED device comprises a reflective metal, an inorganic dielectric stack, a polymeric multilayer film, or a combination thereof.

Item 35 is the light emitting device of item 31 to item 34, wherein the substrate comprises a material substantially absorptive to light emitted by the OLED device such that light emitted by the OLED device is capable of passing through the backplane.

Item 36 is the light emitting device of item 35, wherein the material is also substantially absorptive to ambient visible light passing through the OLED device.

Item 37 is the image display device of item 31 to item 36, wherein the plurality of light emitting devices comprise an active matrix organic light emitting diode (AMOLED) device.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A light emitting device, comprising:
    an organic light emitting diode (OLED) device having a top electrode and an opposing bottom electrode disposed on a backplane, wherein each of the top electrode, the opposing bottom electrode and the backplane are substantially transparent to light emitted by the OLED device;
    a capping layer disposed immediately adjacent the top electrode; and
    a light extraction film disposed adjacent the capping layer, wherein the light extraction film comprises a substrate comprising a material substantially reflective to light emitted by the OLED device, such that a portion of the light emitted by the OLED device reflects from the substrate and passes through the backplane, a layer of nanostructures applied to the substrate, and a backfill layer disposed over the nanostructures and adjacent the capping layer, the backfill layer having an index of refraction greater than the index of refraction of the nanostructures.

2. The light emitting device of claim 1, wherein the material substantially reflective to light emitted by the OLED device comprises a reflective metal, an inorganic dielectric stack, a polymeric multilayer film, or a combination thereof.

3. The light emitting device of claim 1, wherein the backfill layer comprises an adhesive for bonding the light extraction film to the capping layer.

4. The light emitting device of claim 1, further comprising an adhesive optical coupling layer disposed immediately adjacent the capping layer.

5. The light emitting device of claim 1, wherein the layer of nanostructures are applied to the substrate by embossing into a major surface of the substrate.

6. The light emitting device of claim 1, wherein the layer of nanostructures are applied to the substrate by patterning a coating.

7. The light emitting device of claim 1, wherein the layer of nanostructures comprise particulate nanostructures, non-particulate nanostructures, or a combination thereof.

8. The light emitting device of claim 7, wherein the non-particulate nanostructures comprise an engineered nanoscale pattern.

9. The light emitting device of claim 1, wherein the backfill layer comprises a non-scattering nanoparticle filled polymer.

10. The light emitting device of claim 1, wherein at least one of the top electrode and the opposing bottom electrode comprises a transparent conductive oxide.

11. The light emitting device of claim 10, wherein the transparent conductive oxide comprises a thickness less than about 300 nm.

12. The light emitting device of claim 10, wherein the transparent conductive oxide comprises a thickness less than about 100 nm.

13. The light emitting device of claim 10, wherein the transparent conductive oxide comprises a thickness less than about 30 nm.

14. The light emitting device of claim 1, wherein the capping layer comprises a material having a refractive index greater than about 1.7.

15. The light emitting device of claim 1, wherein the capping layer comprises molybdenum oxide, indium tin oxide, zinc selenide, or a combination thereof.

16. The light emitting device of claim 1, wherein the capping layer comprises a thickness between about 60 nm and 400 nm.

17. The light emitting device of claim 1, wherein the light extraction film comprises nanostructures having a variable pitch.

18. The light emitting device of claim 1, wherein the light extraction film comprises nanostructures having a pitch of about 400 nm, about 500 nm, about 600 nm, or a combination thereof.

19. An active matrix organic light emitting diode (AMOLED) device, comprising:
    an array of light emitting devices, each light emitting device comprising:
        an organic light emitting diode (OLED) device having a top electrode and an opposing bottom electrode disposed on a backplane, wherein each of the top electrode, the opposing bottom electrode and the backplane are substantially transparent to light emitted by the OLED device;
        a capping layer disposed immediately adjacent the top electrode; and
    a light extraction film disposed over the array of light emitting devices, the light extraction film adjacent the capping layer,
    wherein the light extraction film comprises a substrate comprising a material substantially reflective to light emitted by the OLED device, such that a portion of the light emitted by the OLED reflects from the substrate and passes through the backplane, a layer of nanostructures applied to the substrate, and a backfill layer disposed over the nanostructures and adjacent the capping layer, the backfill layer having an index of refraction greater than the index of refraction of the nanostructures.

20. The AMOLED device of claim 19, wherein the material substantially reflective to light emitted by the OLED device comprises a reflective metal, an inorganic dielectric stack, a polymeric multilayer film, or a combination thereof.

21. The AMOLED device of claim 19, wherein the backfill layer comprises an adhesive for bonding the light extraction film to the capping layer.

22. The AMOLED device of claim 19, further comprising an adhesive optical coupling layer disposed immediately adjacent the capping layer.

23. An image display device, comprising:
 a plurality of light emitting devices, each light emitting device comprising:
  an organic light emitting diode (OLED) device having a top electrode and an opposing bottom electrode disposed on a backplane, wherein each of the top electrode, the opposing bottom electrode and the backplane are substantially transparent to light emitted by the OLED device;
  a capping layer disposed immediately adjacent the top electrode;
 a light extraction film disposed adjacent the capping layer; and
 an electronic circuit capable of activating each of the light emitting devices,
 wherein the light extraction film comprises a substrate comprising a material substantially reflective to light emitted by the OLED device, such that a portion of the light emitted by the OLED device reflects from the substrate and passes through the backplane, a layer of nanostructures applied to the substrate, and a backfill layer disposed over the nanostructures and adjacent the capping layer, the backfill layer having an index of refraction greater than the index of refraction of the nanostructures.

24. The light emitting device of claim 23, wherein the material substantially reflective to light emitted by the OLED device comprises a reflective metal, an inorganic dielectric stack, a polymeric multilayer film, or a combination thereof.

25. The image display device of claim 23, wherein the plurality of light emitting devices comprise an active matrix organic light emitting diode (AMOLED) device.

* * * * *